United States Patent
Park et al.

(10) Patent No.: US 12,119,336 B2
(45) Date of Patent: Oct. 15, 2024

(54) FUSION MEMORY DEVICE AND METHOD OF FABRICATING THE SAME

(71) Applicant: Samsung Electronics Co., Ltd., Suwon-si (KR)

(72) Inventors: Hyunmog Park, Seoul (KR); Daehyun Kim, Suwon-si (KR); Jinmin Kim, Seoul (KR); Hei Seung Kim, Suwon-si (KR); Hyunsik Park, Seoul (KR); Sangkil Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/883,682

(22) Filed: Aug. 9, 2022

(65) Prior Publication Data

US 2022/0384410 A1    Dec. 1, 2022

Related U.S. Application Data

(63) Continuation of application No. 16/459,725, filed on Jul. 2, 2019, now Pat. No. 11,462,528.

(30) Foreign Application Priority Data

Dec. 21, 2018    (KR) ........................ 10-2018-0167111

(51) Int. Cl.
*H01L 25/18* (2023.01)
*G11C 14/00* (2006.01)
(Continued)

(52) U.S. Cl.
CPC .......... *H01L 25/18* (2013.01); *G11C 14/0018* (2013.01); *G11C 16/04* (2013.01);
(Continued)

(58) Field of Classification Search
CPC ......... H01L 25/18; H01L 25/50; H10B 41/00; H10B 12/00
See application file for complete search history.

(56) References Cited

U.S. PATENT DOCUMENTS

| 4,888,820 A | 12/1989 | Chen et al. |
| 6,140,672 A | 10/2000 | Arita et al. |

(Continued)

FOREIGN PATENT DOCUMENTS

| JP | 2003243632 A | 8/2003 |
| JP | 2011204829 A * | 10/2011 |

(Continued)

*Primary Examiner* — Michele Fan
(74) *Attorney, Agent, or Firm* — Muir Patent Law, PLLC

(57) ABSTRACT

Disclosed are fusion memory devices and methods of fabricating the same. The fusion memory device comprises a first memory device including a first substrate having active and inactive surfaces opposite to each other and a first memory cell circuit on the active surface of the first substrate, a non-memory device including a second substrate having active and inactive surfaces opposite to each other and a non-memory circuit on the active surface of the second substrate, the non-memory device being provided on the first memory device, and a second memory device on the inactive surface of the second substrate and including a second memory cell circuit different from the first memory cell circuit. The non-memory device lies between the first and second memory cell circuits and controls an electrical operation of each of the first and second memory cell circuits.

20 Claims, 8 Drawing Sheets

(51) Int. Cl.
   *G11C 16/04*     (2006.01)
   *H01L 23/48*     (2006.01)
   *H01L 23/522*    (2006.01)
   *H01L 25/00*     (2006.01)
   *H10B 41/00*     (2023.01)
   *H10B 41/27*     (2023.01)
   *H10B 43/27*     (2023.01)
   *G11C 13/00*     (2006.01)
   *H10B 41/41*     (2023.01)

(52) U.S. Cl.
   CPC ........ *H01L 23/481* (2013.01); *H01L 23/5226* (2013.01); *H01L 25/50* (2013.01); *H10B 41/27* (2023.02); *H10B 43/27* (2023.02); *G11C 13/0004* (2013.01); *H10B 41/41* (2023.02)

(56) References Cited

U.S. PATENT DOCUMENTS

| | | | |
|---|---|---|---|
| 6,917,062 B2 | 7/2005 | Natori | |
| 8,362,615 B2 | 1/2013 | Lai et al. | |
| 8,476,708 B2 | 7/2013 | Fukuzumi et al. | |
| 8,735,902 B2 | 5/2014 | Tang et al. | |
| 9,219,098 B2 | 12/2015 | Lee | |
| 9,240,405 B2 | 1/2016 | Chen et al. | |
| 9,887,199 B2 | 2/2018 | Lim et al. | |
| 9,905,602 B2 | 2/2018 | Takahashi et al. | |
| 9,935,037 B2 | 4/2018 | Kang et al. | |
| 10,283,493 B1* | 5/2019 | Nishida | H10B 43/27 |
| 2009/0305502 A1 | 12/2009 | Lee et al. | |
| 2012/0163413 A1 | 6/2012 | Kim et al. | |
| 2015/0206900 A1* | 7/2015 | Nam | H10B 43/35 438/269 |
| 2016/0225783 A1 | 8/2016 | Ishibashi | |
| 2016/0247819 A1* | 8/2016 | Sim | H01L 29/42344 |
| 2017/0358564 A1 | 12/2017 | Lee et al. | |
| 2018/0026019 A1 | 1/2018 | Tao et al. | |
| 2018/0151583 A1 | 5/2018 | Lupino et al. | |
| 2018/0158526 A1 | 6/2018 | Kim et al. | |
| 2019/0074283 A1 | 3/2019 | Amaki et al. | |

FOREIGN PATENT DOCUMENTS

| | | |
|---|---|---|
| KR | 10-2015-0106660 A | 9/2015 |
| KR | 10-2018-0062812 A | 6/2018 |
| KR | 10-2449571 B1 | 10/2022 |

* cited by examiner

FUSION MEMORY DEVICE AND METHOD OF FABRICATING THE SAME

CROSS-REFERENCE TO RELATED APPLICATION

This U.S. nonprovisional application is a continuation of U.S. patent application Ser. No. 16/459,725, filed Jul. 2, 2019, in the U.S. Patent and Trademark Office, which claims priority under 35 U.S.C § 119 to Korean Patent Application No. 10-2018-0167111, filed on Dec. 21, 2018, in the Korean Intellectual Property Office, the entire contents of both of which are hereby incorporated by reference.

BACKGROUND

The present inventive concepts relate to a semiconductor memory device and a method of fabricating the same, and more particularly, to a fusion memory device in which heterogeneous memory devices are merged with each other and a method of fabricating the same.

Attempts have been made to merge heterogeneous memory devices with each other to utilize their different electrical characteristics. The followings are examples of a fusion memory device: a combination of nonvolatile memory device, such as NAND Flash memory or NOR Flash memory, and volatile memory device, such as SRAM or DRAM, or a combination of volatile memory devices, such as Flash memory, PRAM, MRAM, or RRAM.

A method of combining heterogeneous memory devices includes stacking heterogeneous memory devices and using bonding wires or through electrodes to electrically connect the heterogeneous memory devices to each other. This method is advantageous for compatibility in fabricating heterogeneous memory devices, but disadvantageous for reducing manufacturing costs in fabricating individual memory devices and to secure areas for bonding wires.

Another method of combining heterogeneous memory devices includes forming a peripheral circuit for driving each memory device and performing successive processes to sequentially form heterogeneous memory devices stacked on the peripheral circuit. In this method, the pre-formed peripheral circuit or memory device is affected by subsequent processes required for forming other memory device. For example, when the subsequent process is performed at high temperatures, it is likely that heat deteriorates electrical characteristics of the pre-formed peripheral circuit or memory device. Therefore, there may be limitations in forming memory devices with desired electrical performance.

As discussed above, the successive formation of heterogeneous memory devices may lack in process compatibility. Accordingly, it may be required that a fusion memory device and a method of fabricating the same having desired electrical performance without being affected by subsequent processes.

SUMMARY

Some example embodiments of the present inventive concepts provide a fusion memory device without being affected by subsequent processes and a method of fabricating the same.

Some example embodiments of the present inventive concepts provide a fusion memory device having desired electrical performance and a method of fabricating the same.

Some example embodiments of the present inventive concepts provide a fusion memory device securing compatibility and a method of fabricating the same.

According to example embodiments, the disclosure is directed to a fusion memory device, comprising: a first memory device including a first substrate having an active surface and an inactive surface opposite to each other and a first memory cell circuit on the active surface of the first substrate; a non-memory device including a second substrate having an active surface and an inactive surface opposite to each other and a non-memory circuit on the active surface of the second substrate, the non-memory device being provided on the first memory device; and a second memory device on the inactive surface of the second substrate and including a second memory cell circuit different from the first memory cell circuit, wherein the non-memory device is provided between the first memory cell circuit and the second memory cell circuit and configured to control an electrical operation of each of the first memory cell circuit and the second memory cell circuit.

According to example embodiments, the disclosure is directed to a fusion memory device, comprising: a lower memory device including a lower substrate having an active surface and an inactive surface opposite to each other and a plurality of lower memory cells stacked on the active surface of the lower substrate; a non-memory device including an upper substrate having an active surface and an inactive surface opposite to each other and a plurality of electrical lines on the active surface of the upper substrate, the non-memory device being stacked on the lower memory device; and an upper memory device including a plurality of upper memory cells that are different from the lower memory cells and are stacked on the inactive surface of the upper substrate, the upper memory device being stacked on the non-memory device, wherein the upper memory cells and the lower memory cells are electrically connected to the electrical lines.

According to example embodiments, the disclosure is directed to a method of fabricating a fusion memory device, the method comprising: forming a first memory cell circuit including a plurality of first memory cells on an active surface of a first substrate; forming a non-memory circuit including a plurality of electrical lines on an active surface of a second substrate; combining the first memory cell circuit with the non-memory circuit; and forming a second memory cell circuit including a plurality of second memory cells on an inactive surface of the second substrate, wherein forming the first memory cell circuit and forming the non-memory circuit are performed independently of each other, and wherein forming the first memory cell circuit is performed at a temperature higher than a temperature of forming the second memory cell circuit.

DETAILED DESCRIPTION OF EMBODIMENTS

Figure 1:
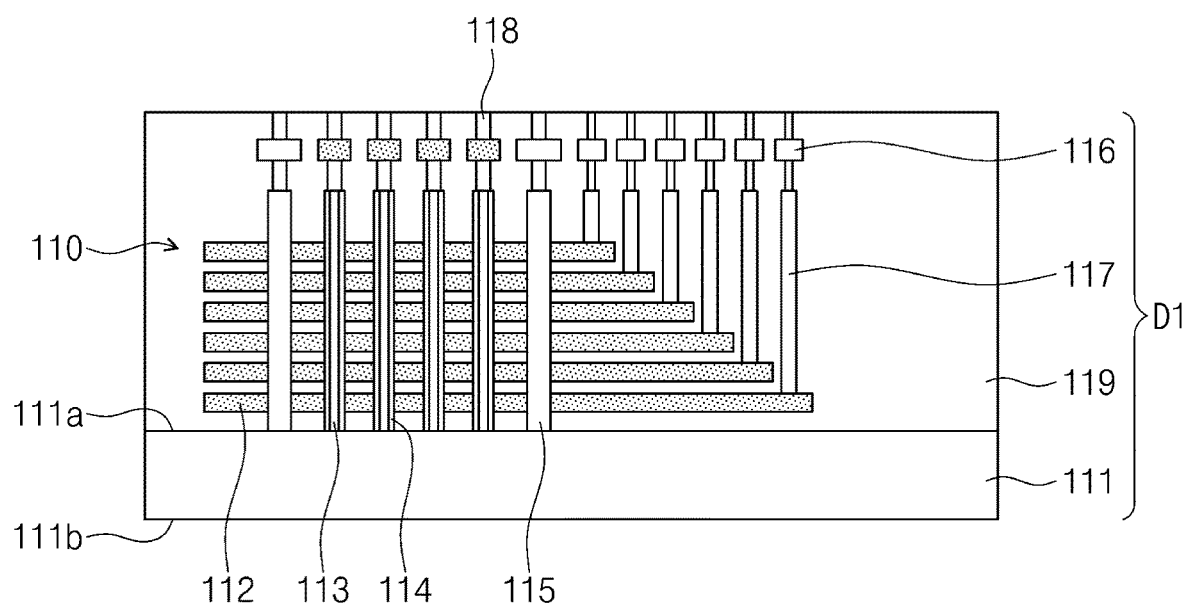
FIG. 1 illustrates a cross-sectional view showing a process of forming a first semiconductor device in a method of fabricating a fusion memory device, according to some example embodiments of the present inventive concepts.

The following will now describe in detail fusion memory devices and methods of fabricating the same in conjunction with the accompanying drawings. Throughout the drawings, like reference numerals indicate like elements.

Spatially relative terms, such as "beneath," "below," "lower," "above," 'upper' and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

FIG. 1 illustrates a cross-sectional view showing a process of forming a first semiconductor device in a method of fabricating a fusion memory device according to some example embodiments of the present inventive concepts.

Referring to FIG. 1, a first semiconductor device D1 including a first substrate 111 and a first circuit 110 may be provided. The first semiconductor device D1, as well as the other devices described herein, may be embodied as a semiconductor chip (e.g., an integrated circuit device part of or cut from a wafer). The first substrate 111 may have an active surface 111a and an inactive surface 111b opposite thereto. The first substrate 111 may be a semiconductor substrate, such as a crystalline silicon (e.g., part of a silicon substrate wafer). The first substrate 111 may be provided in and/or on its active surface 111a with a first circuit 110 encapsulated with a dielectric layer 119. The dielectric layer 119 may have a multi-layered structure in which are stacked a plurality of one or more of a silicon oxide layer and a silicon nitride layer. An active surface of a substrate or semiconductor device as described herein corresponds to a surface of the substrate on which various patterned layers of the semiconductor device are sequentially formed on the semiconductor substrate during manufacturing the device (i.e., patterned layers integrally formed as part of a semiconductor chip or semiconductor devices integrally formed in a wafer to form the integrated circuit of the device(s) during manufacturing of the device). The active surface of a semiconductor device (chip) may be the upper surface of the semiconductor chip (or, when part of a wafer prior to singulation, the upper surface of the semiconductor device corresponding to the chip) above the active surface of the substrate. An inactive surface as used herein refers to the surface of the substrate or device opposite to the active surface (sometimes referred to as a backside). An inactive surface of a device may be the same as the inactive surface of a substrate.

The first circuit 110 may include a plurality of gate electrodes 112 staircase-stacked on the active surface 111a of the first substrate 111, a plurality of vertical channels 113 having pillar shapes vertically penetrating the gate electrodes 112, and memory layers 114 surrounding the vertical channels 113. The memory layers 114 may include a tunnel dielectric layer adjacent to the vertical channel 113, a blocking dielectric layer adjacent to the gate electrode 112, and a charge storage layer between the tunnel dielectric layer and the blocking dielectric layer.

The first circuit 110 may further include a plurality of common source plugs 115 electrically connected to the first substrate 111, a plurality of metal contacts 117 coupled to ends of the gate electrodes 112, and a plurality of electrical lines 116 provided on the gate electrodes 112. The electrical lines 116 may be electrically connected to the vertical channels 113, the common source plugs 115, and the metal contacts 117.

The gate electrodes 112 may constitute a ground select line closest to the first substrate 111, a string select line farthest away from the first substrate 111, and a plurality of word lines between the ground and string select lines. Among the electrical lines 116, ones electrically connected to the vertical channels 113 may constitute bit lines. The word lines and the bit lines may extend to intersect each other. For example, the word lines and the bit lines may extend lengthwise in directions perpendicular to one another, and may cross over one another when viewed top-down.

The first circuit 110 configured as discussed above may be a memory cell circuit having memory cells that are vertically stacked and three-dimensionally arranged on the active surface 111a of the first substrate 111, and the first semiconductor device D1 including the first circuit 110 may be a vertical NAND Flash memory. Alternatively, the first circuit 110 may include a plurality of capacitors, and the first semiconductor device D1 including the first circuit 110 may be a dynamic random access memory (DRAM).

A plurality of first outer terminals 118 may further be formed to have connection with the electrical lines 116. The first outer terminals 118 may be exposed by the dielectric layer 119. For example, top surfaces of the first outer terminals 118 may be coplanar with a top surface of the dielectric layer 119. Alternatively, the first outer terminals 118 may protrude above the dielectric layer 119. The first outer terminals 118 may be shaped like a pillar, a solder ball, a solder bump, or a pad.

Figure 2:
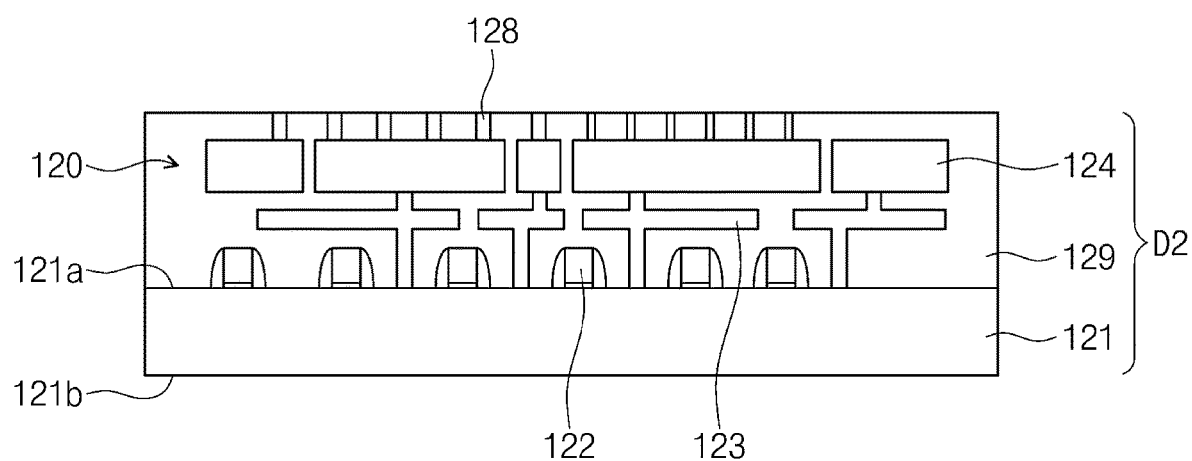
FIG. 2 illustrates a cross-sectional view showing a process of forming a second semiconductor device in a method of fabricating a fusion memory device, according to some example embodiments of the present inventive concepts.

FIG. 2 illustrates a cross-sectional view showing a process of forming a second semiconductor device in a method of fabricating a fusion memory device, according to some example embodiments of the present inventive concepts.

Referring to FIG. 2, a second semiconductor device D2 including a second substrate 121 and a second circuit 120 may be provided. The second substrate 121 may have an active surface 121a and an inactive surface 121b opposite thereto. The second substrate 121 may be a semiconductor substrate, such as a silicon wafer (or a portion thereof). The second substrate 121 may be provided on its active surface 121a with a second circuit 120 encapsulated with a dielectric layer 129. The dielectric layer 129 may have a multi-layered structure in which are stacked a plurality of one or more of a silicon oxide layer and a silicon nitride layer.

The second circuit 120 may include a plurality of transistors 122 provided on the active surface 121a of the second substrate 121, a plurality of connection lines 123 electrically connected to the transistors 122, and a plurality of metal lines 124 electrically connected through the connection lines 123 to the transistors 122.

The second circuit 120 may include a peripheral circuit that controls an operation of the first semiconductor device D1. For example, the second circuit 120 may include high-voltage transistors suitable for the first semiconductor device D1 that can operate at relatively high voltages and also include low-voltage transistors suitable for an operation at relatively low voltages.

In addition, the second circuit 120 may further include a peripheral circuit that controls an operation of a third semiconductor device D3 which will be discussed below with reference to FIG. 5. Accordingly, the second circuit 120 may have a peripheral circuit structure suitable for an operation of the first semiconductor device D1 shown in FIG. 1 and an operation of the third semiconductor device D3 shown in FIG. 5. The second semiconductor device D2 may be a non-memory device. In certain embodiments, the second semiconductor device D2 may include an application processor AP and/or a logic device circuit.

A plurality of second outer terminals 128 may further be formed to have connection with the metal lines 124. The second outer terminals 128 may be exposed by the dielectric layer 129. For example, top surfaces of the second outer terminals 128 may be coplanar with a top surface of the dielectric layer 129. Alternatively, the second outer terminals 128 may protrude above the dielectric layer 129. The second outer terminals 128 may be shaped like a pillar, a solder ball, a solder bump, or a pad.

Referring together to FIGS. 1 and 2, the formation of the first semiconductor device D1 may be performed independently of the formation of the second semiconductor device D2. Therefore, one of the two formations may not be affected by the other of the two formations. For example, critical dimensions and/or process temperatures may be independently established to form the first semiconductor device D1 and the second semiconductor device D2 separately from each other.

In contrast, when the first circuit 110 is formed on the second circuit 120 that is formed previously, or when the second circuit 120 and the first circuit 110 are formed at the same time, a relatively high process temperature required for forming the first circuit 110 may deteriorate electrical characteristics of the second circuit 120. For example, a high process temperature may cause short channel effects such as punch-through of the transistors 122.

In certain embodiments, because the formation of the first semiconductor device D1 and the formation of the second semiconductor device D2 are performed independently of each other, the formation of the first circuit 110 and the formation of the second circuit 120 may not affect each other at all. As such, the first circuit 110 and the second circuit 120 may have process independence, and thus the transistor 122 may be reduced to the least possible size when the second circuit 120 is formed. Thus, the second semiconductor device D2 may be formed to include the second circuit 120 having superior electrical characteristics, such as operating voltage and operating speed.

Figure 3:
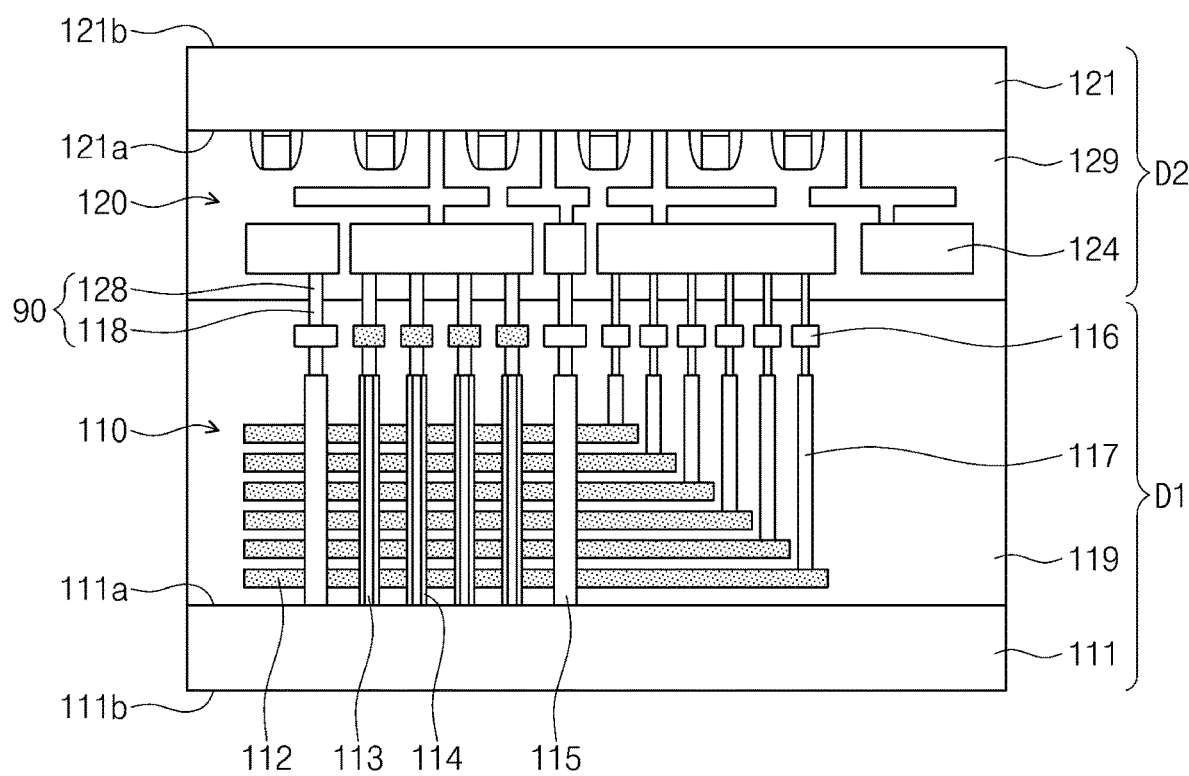
FIG. 3 illustrates a cross-sectional view showing a process of combining a first semiconductor device and a second semiconductor device in a method of fabricating a fusion memory device, according to some example embodiments of the present inventive concepts.

FIG. 3 illustrates a cross-sectional view showing a process of combining a first semiconductor device and a second semiconductor device in a method of fabricating a fusion memory device according to some example embodiments of the present inventive concepts.

Referring to FIG. 3, the first semiconductor device D1 and the second semiconductor device D2 may be combined with each other. Although not shown in the figures, the semiconductor devices that are combined with each other, as described herein (with respect to this and other embodiments), may be combined with each other when the semiconductor devices are part of a wafer (e.g., a wafer containing identical semiconductor devices integrally formed as part of the wafer). For example, the first semiconductor device D1 may be part of a first wafer having a plurality of devices that are identical to the first semiconductor device D1 and the second semiconductor device D2 may be part of a second wafer having a plurality of devices that are identical to the second semiconductor device D2. Thus, in combining the first semiconductor device D1 and the second semiconductor device D2 shown in FIG. 3, each of a plurality of first semiconductor devices may be combined with a corresponding one of a plurality of second semiconductor devices at the same time. Similarly, the other processes described herein may occur at the wafer level so that a process is performed simultaneously with respect to all of the devices within a wafer. For example, after combining the semiconductor devices as a combination of semiconductor wafers, the combined semiconductor wafers may be cut to singulate chip combinations from each other. The first semiconductor device D1 may be provided thereon with the second semiconductor device D2 turned upside down, and the first outer terminals 118 may be positioned to correspond to the second outer terminals 128. For example, the first and second outer terminals 118 and 128 may be aligned with one another in the vertical direction. The corresponding outer terminals 118 and 128 may be bonded to each other to form connection terminals 90. For example, a pair of corresponding outer terminals 118 and 128 may be provided either with heat or with solder and heat, and then bonded to each other to form the connection terminals 90.

The first circuit 110 of the first semiconductor device D1 may be physically and electrically connected through the connection terminals 90 to the second circuit 120 of the second semiconductor device D2. The second circuit 120 of the second semiconductor device D2 may serve as a peripheral circuit that operates the first circuit 110 of the first semiconductor device D1.

Because the first semiconductor device D1 is provided thereon with the second semiconductor device D2 turned upside down as discussed above, the first semiconductor device D1 may stand upright and the second semiconductor device D2 may stand inverted. The active surface 111a of the first substrate 111 may face the active surface 121a of the second substrate 121, and the inactive surfaces 111b and 121b of the first and second substrates 111 and 121 may face in opposite directions and be exposed to the outside.

Figure 4:
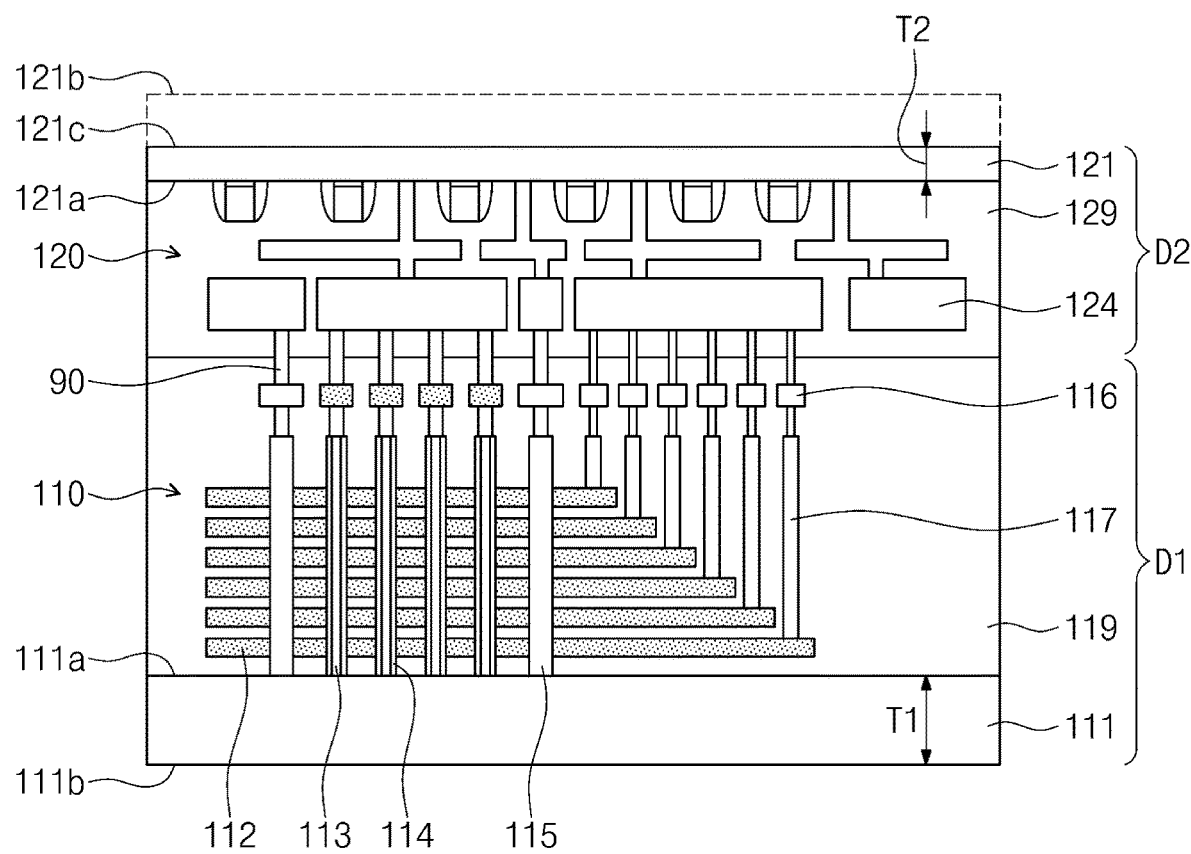
FIG. 4 illustrates a cross-sectional view showing a process of thinning a substrate in a method of fabricating a fusion memory device, according to some example embodiments of the present inventive concepts.

FIG. 4 illustrates a cross-sectional view showing a process of thinning a substrate in a method of fabricating a fusion memory device, according to some example embodiments of the present inventive concepts.

Referring to FIG. 4, the second substrate 121 may be thinned physically or chemically. For example, the inactive surface 121b of the second substrate 121 may undergo a chemical mechanical polishing process or an etching process to form an inactive surface 121c closer to the active surface 121a than the inactive surface 121b. The thinned second substrate 121 may have a thickness T2 less than a thickness T1 of the first substrate 111.

The reduced thickness T2 of the second substrate 121 may decrease a total height of a fusion memory device 1, which will be discussed below with reference to FIG. 5, and allow the second semiconductor device D2 to have an easy electrical connection with a third semiconductor device D3, which will be discussed below with reference to FIG. 5. In some embodiments, the thinning of the second substrate 121 may not be performed.

Figure 5:
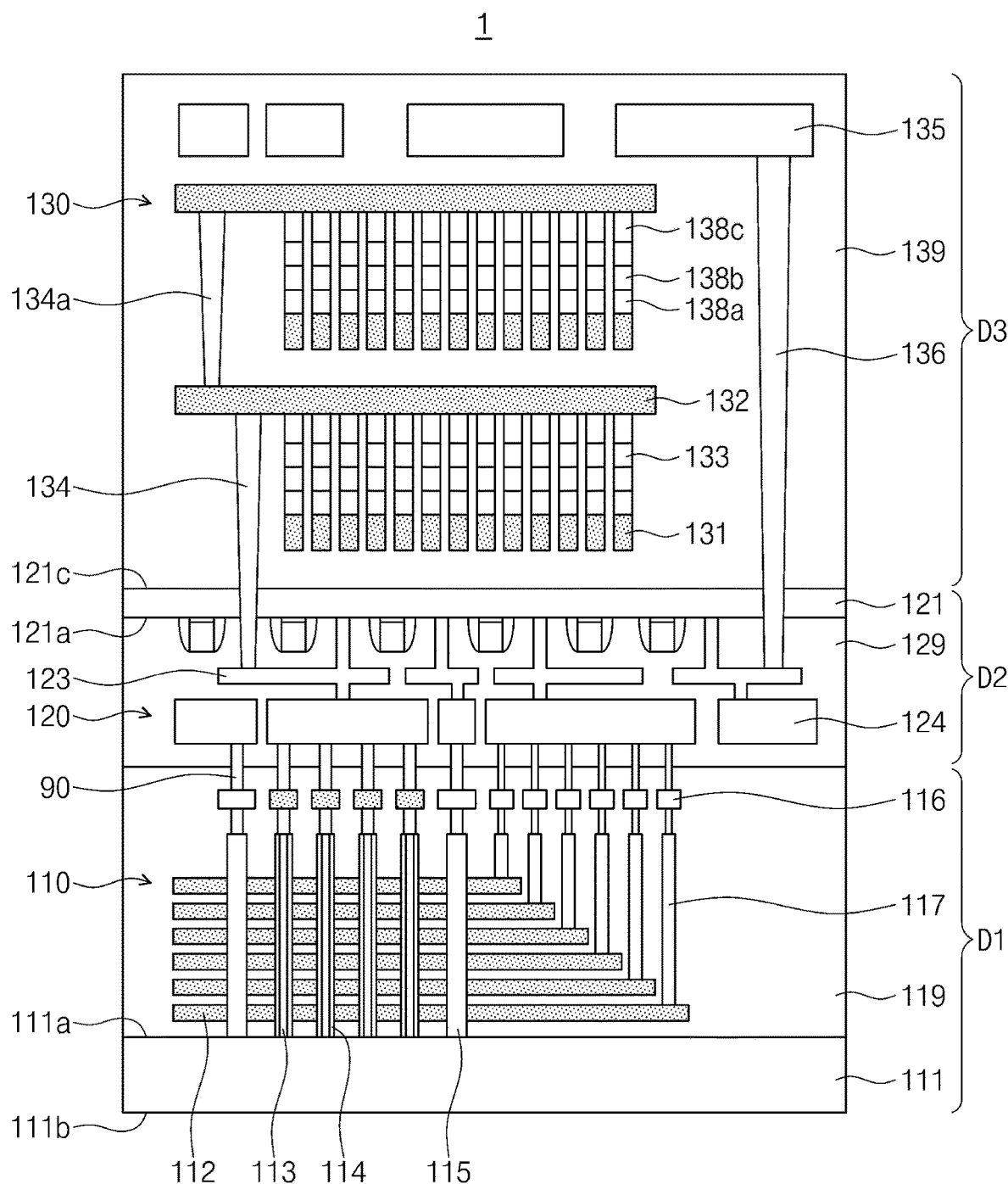
FIG. 5 illustrates a cross-sectional view showing a process of forming a third semiconductor device in a method of fabricating a fusion memory device, according to some example embodiments of the present inventive concepts.
Figure 6:
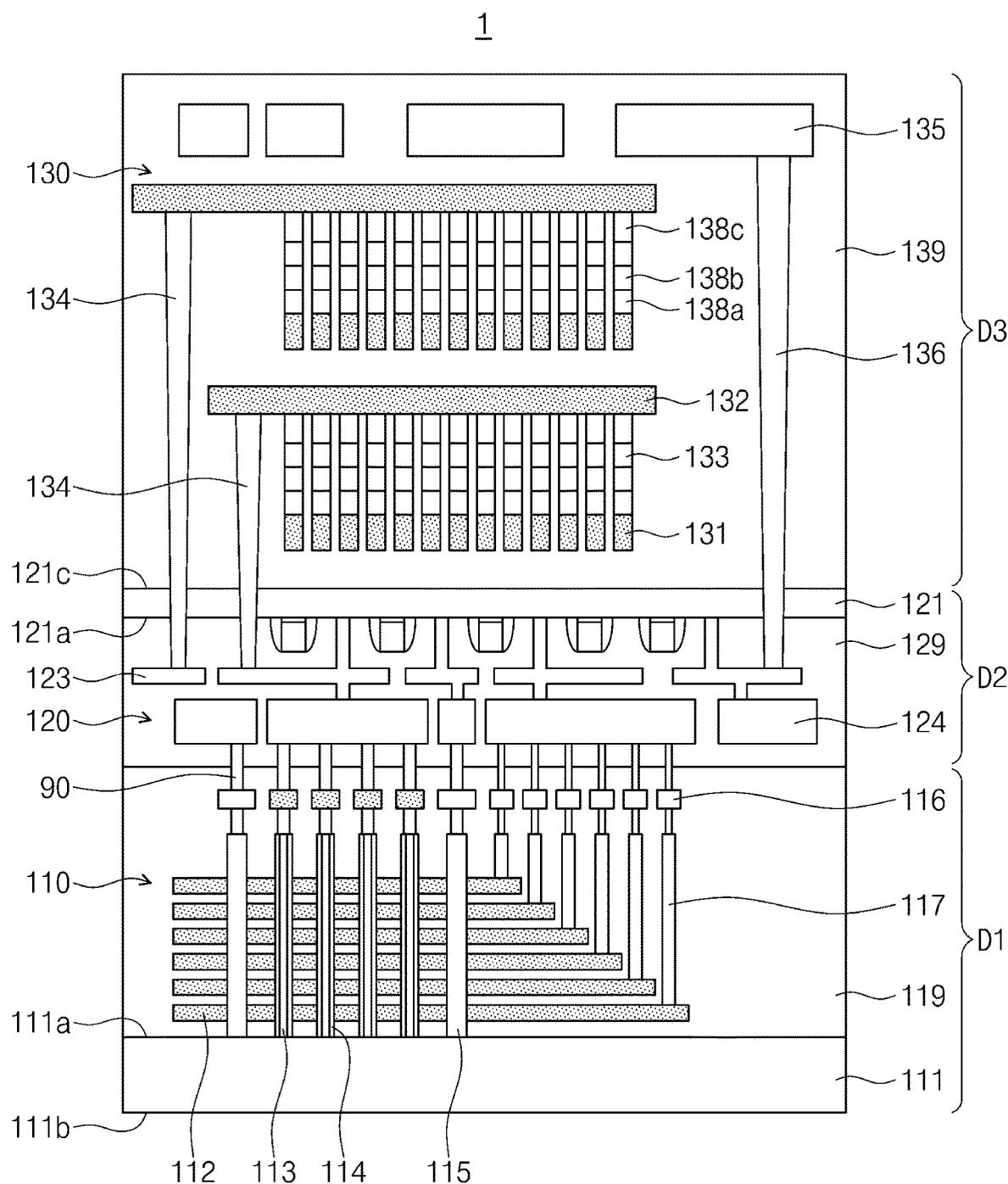
FIG. 6 illustrates a cross-sectional view showing a fusion memory device, according to some example embodiments of the present inventive concepts.

FIG. 5 illustrates a cross-sectional view showing a process of forming a third semiconductor device in a method of fabricating a fusion memory device, according to some example embodiments of the present inventive concepts. FIG. 6 illustrates a cross-sectional view of a fusion memory device showing another example of a fusion memory device shown in FIG. 5, according to some example embodiments of the present inventive concepts.

Referring to FIG. 5, the second substrate 121 may be provided on its recessed inactive surface 121c with a third semiconductor device D3 including a third circuit 130 encapsulated with a dielectric layer 139. The dielectric layer 139 may have a multi-layered structure in which are stacked a plurality of one or more of a silicon oxide layer and a silicon nitride layer. The formation of the third semiconductor device D3 may be used to fabricate a fusion memory device 1 in which are sequentially stacked the first semiconductor memory device D1, the second semiconductor device D2, and the third semiconductor device D3.

The third circuit 130 may include a plurality of word lines 131 horizontally extending in parallel on the inactive surface 121c of the second substrate 121, a plurality of bit lines 132 lying on and crossing the word lines 131, and a plurality of memory layers 133 provided on corresponding intersections between the word lines 131 and the bit lines 132. For example, a plurality of memory layers 133 may be stacked on one another between the word lines 131 and the bit lines 132 at locations where the word lines 131 and bit lines 132 cross over one another. A selection element 138a and a lower electrode 138b may be formed between the word line 131 and the memory layer 133. An upper electrode 138c may be formed between the bit line 132 and the memory layer 133.

The memory layer 133 may be a variable resistance layer. For example, the memory layer 133 may include a phase change material such as chalcogenide, a magnetic tunnel junction consisting of two magnetic layers and a dielectric layer therebetween, or a variable resistance material such as a perovskite compound or transition metal oxide. The third circuit 130 may write or read data by using phase change, magnetization direction change, or resistance change in the memory layer 133.

The third circuit 130 may be a memory cell circuit having memory cells three-dimensionally arranged and crossed each other on the inactive surface 121c of the second substrate 121. A type of the third semiconductor device D3 may depend on a material included in the memory layer 133. For example, when the memory layer 133 includes a phase change material, the third semiconductor device D3 may be a phase change random access memory (PRAM). For another example, when the memory layer 133 includes a magnetic tunnel junction or a variable resistance material, the third semiconductor device D3 may be a magnetic random access memory (MRAM) or a resistive random access memory (RRAM).

The third circuit 130 may have a double-layered structure as shown in FIG. 5. Alternatively, the third circuit 130 may have a single-layered structure or a multi-layered structure having three or more stories. A plurality of metal lines 135 may be formed on the third circuit 130. Ones or all of the metal lines 135 may be formed in the second semiconductor device D2.

A plurality of through electrodes 134, 134a, and 136 may achieve an electrical connection between the third semiconductor device D3 and the second semiconductor device D2. For example, a through electrode 134, coupled to the bit line 132 of the third circuit 130, may be coupled to the connection line 123 of the second circuit 120 while extending toward the second semiconductor device D2 and penetrating the second substrate 121. Similarly, a through electrode 136, coupled to the metal line 135 of the third semiconductor device D3, may be coupled to another connection line 123 of the second circuit 120 while extending toward the second semiconductor device D2 and penetrating the second substrate 121. The through electrodes 134 and 136 may be electrically insulated from the second substrate 121.

In some embodiments, the bit lines 132 vertically spaced apart may be electrically connected to each other via a through electrode 134a formed therebetween. For example, in an embodiment where the third circuit 130 has a multi-layered structure, a through electrode 134a may electrically connect vertically adjacent bit lines 132. In certain embodiments, as shown in FIG. 6, through electrodes 134 coupled to corresponding bit lines 132 may penetrate the second substrate 121 and have direct connection with the connection lines 123 of the second circuit 120. For example, in an embodiment where the third circuit 130 has a multi-layered structure, all the through electrodes 134 may extend from the bit lines 132 to the connection lines of the second circuit 120.

In some embodiments, the third semiconductor device D3 may be formed on the second semiconductor device D2. For example, one or more etching processes may be performed to form the through electrodes 134 and 136 such that they penetrate the second substrate 121 and have direct connection with the connection lines 123 of the second circuit 120.

Identically or similarly to that of the bit line 132, the word line 131 may have electrical connection with the second circuit 120. This will be further discussed below with reference to FIGS. 7 to 9.

Figure 7:
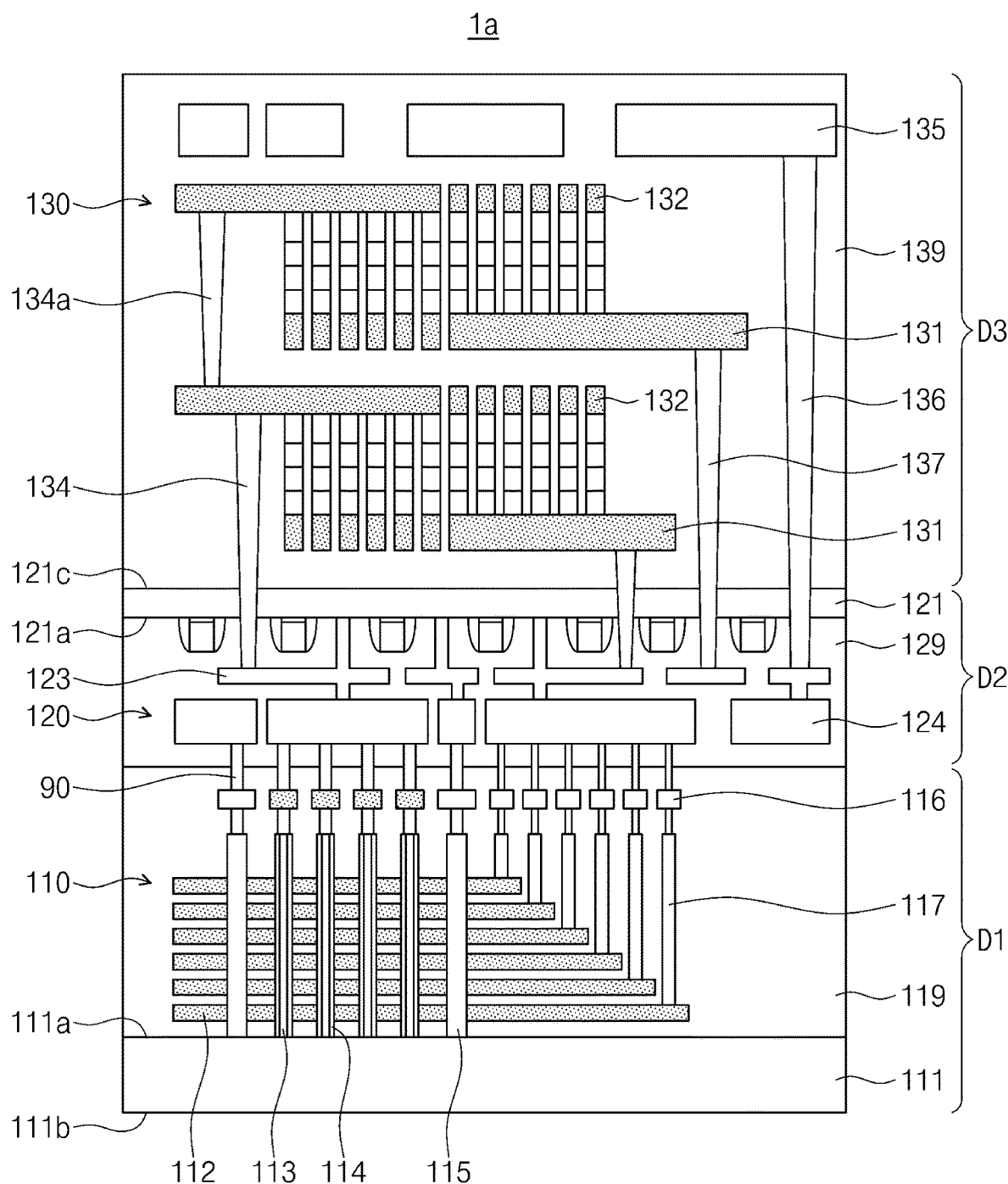
FIG. 7 illustrates a cross-sectional view showing a fusion memory device, according to some example embodiments of the present inventive concepts.
Figure 8:
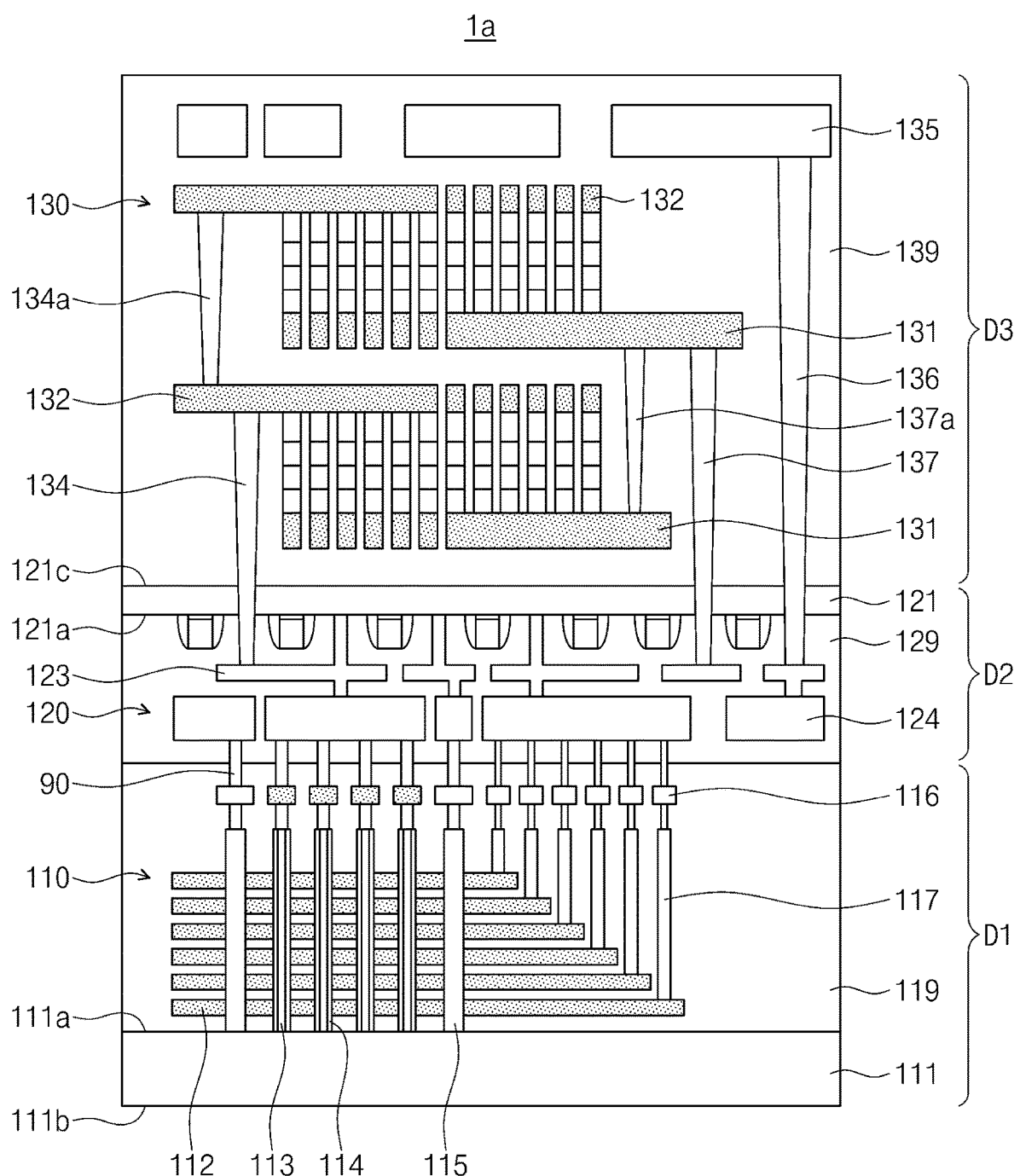
FIG. 8 illustrates a cross-sectional view showing a fusion memory device, according to some example embodiments of the present inventive concepts.
Figure 9:
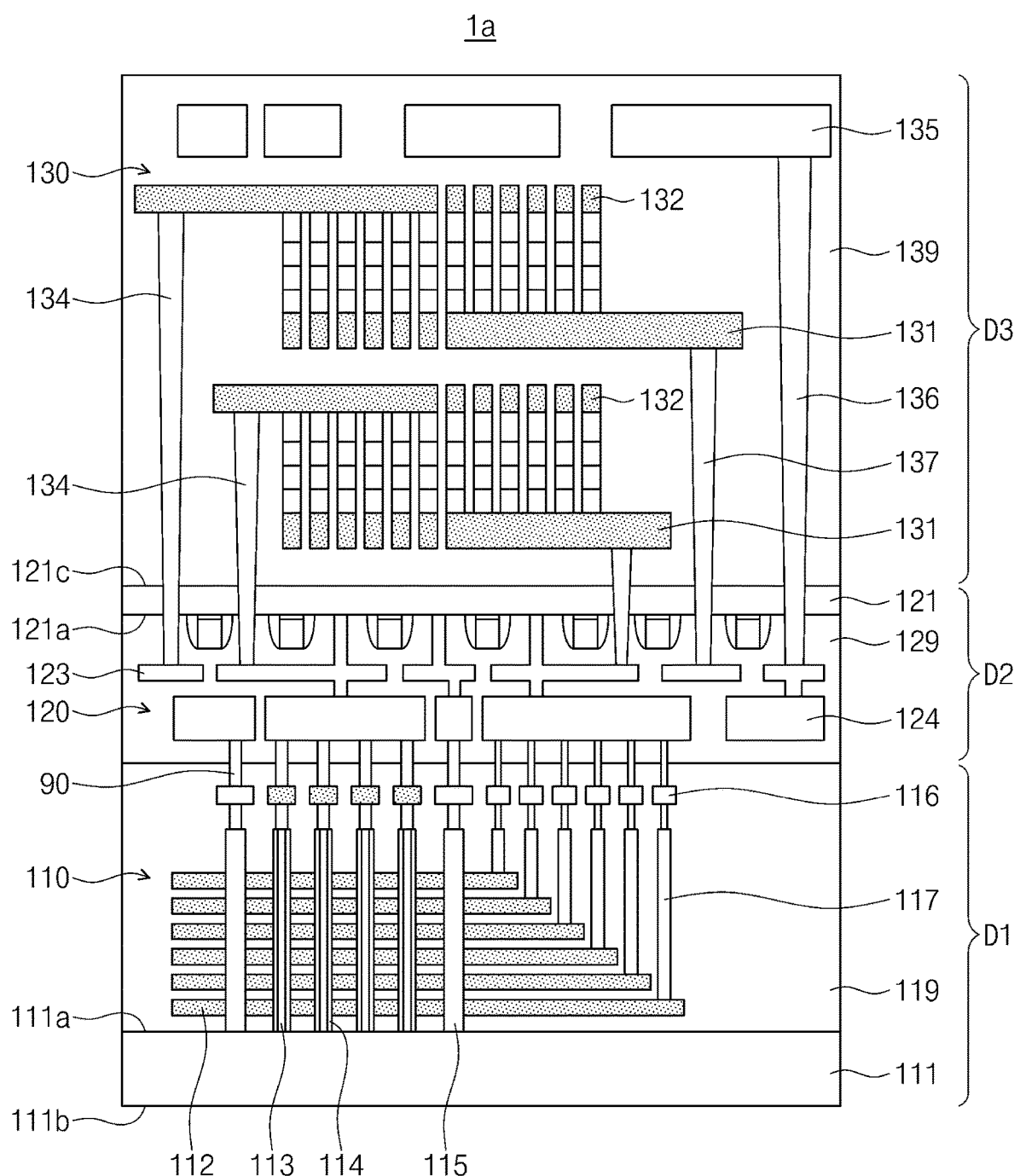
FIG. 9 illustrates a cross-sectional view showing a fusion memory device, according to some example embodiments of the present inventive concepts.

FIGS. 7 to 9 illustrate cross-sectional views showing a fusion memory device 1a, according to some example embodiments of the present inventive concepts.

In FIGS. 7 to 9, to facilitate understanding of an electrical connection between the third semiconductor device D3 and the second semiconductor device D2, the third semiconductor device D3 is shown by both a cross-section along a word-line direction and a cross-section along a bit-line direction. In the embodiments that follow, details different from those of the fusion memory device 1 will be mainly discussed.

Referring to FIG. 7, through electrodes 137, coupled to corresponding word line 131 of the third circuit 130, may be directly coupled to the connection lines 123 of the second circuit 120 while extending toward the second semiconductor device D2 and penetrating the second substrate 121. The through electrodes 137 may be electrically insulated from the second substrate 121, and may be electrically connected to the word line 131 and the connection lines 123.

In one example embodiment, as shown in FIG. 8, the word lines 131 vertically spaced apart may be electrically connected to each other via a through electrode 137a formed therebetween. For example, in an embodiment where the third circuit 130 has a multi-layered structure, a through electrode 137a may electrically connect vertically adjacent word lines 131. In another example embodiment, as shown in FIG. 9, through electrodes 134 coupled to corresponding bit lines 132 may penetrate the second substrate 121 and have direct connection with the connection lines 123 of the second circuit 120. Similarly, through electrodes 137 coupled to corresponding word lines 131 may penetrate the second substrate 121 and have direct connection with the connection lines 123 of the second circuit 120.

In some embodiments, the third semiconductor device D3 may be formed on the second semiconductor device D2. For example, one or more etching processes may be performed to form the through electrodes 134, 136, and 137 such that they penetrate the second substrate 121 and have direct connection with the connection lines 123 of the second circuit 120.

In certain embodiments, a diffusion process may be performed at relatively high temperatures when forming the first circuit 110 constituting the first semiconductor device D1, such as a vertical NAND Flash memory. Likewise, it may be needed a diffusion process when forming the second circuit 120 consisting of a plurality of transistors 122. For example, each of the first and second semiconductor devices D1 and D2 may be formed at temperatures between about 800° C. to about 850° C. or higher.

In contrast, the third semiconductor device D3, such as a variable resistance memory, may be formed at temperatures less those of the first semiconductor device D1 and/or the second semiconductor device D2. In certain embodiments, because the formation of the first and second semiconductor devices D1 and D2 is followed by the formation of the third semiconductor device D3, the formation of the third semiconductor device D3 may not impose any thermal burden at all on the first semiconductor device D1 and the second semiconductor device D2. Accordingly, the first and second semiconductor devices D1 and D2 may be prevented from thermal deterioration.

According to the present inventive concepts, the formation of a memory device and the formation of a non-memory device may be performed separately from each other, and thus process independence may be secured. Therefore, the memory and non-memory devices may be formed to have desired electrical performance without any design limitation.

In addition, the formation of a low-temperature memory device may be performed after the formation of a high-temperature memory device. Thus, neither the high-temperature memory device nor the non-memory device may be affected by subsequent processes required for forming the low-temperature memory device.

As a result, it may be possible to achieve a fusion memory device with superior electrical characteristics of each of the memory and non-memory devices.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A method of fabricating a fusion memory device, the method comprising:
forming a first memory cell circuit including a plurality of first memory cells on an active surface of a first substrate;
forming a non-memory circuit including a plurality of conductive lines on an active surface of a second substrate;
combining the first memory cell circuit with the non-memory circuit; and
forming a second memory cell circuit including a plurality of second memory cells on an inactive surface of the second substrate,
wherein forming the first memory cell circuit and forming the non-memory circuit are performed independently of each other, and
wherein forming the first memory cell circuit is performed at a first temperature higher than a second temperature of forming the second memory cell circuit, and
wherein forming the second memory cell circuit does not include a diffusion process.

2. The method of claim 1, wherein combining the first memory cell circuit with the non-memory circuit includes combining the first substrate and the second substrate with each other to allow the active surface of the second substrate to face the active surface of the first substrate.

3. The method of claim 1, further comprising:
after combining the first memory cell circuit with the non-memory circuit, thinning the second substrate physically or chemically.

4. The method of claim 1, wherein forming the first memory cell circuit includes:
vertically stacking a plurality of gate electrodes on the active surface of the first substrate;
forming a plurality of vertical channels vertically penetrating the plurality of gate electrodes, each of the vertical channels being surrounded by a memory layer; and
forming a plurality of electrical lines electrically connected to the vertical channels.

5. The method of claim 4, wherein forming the first memory cell circuit further includes:
performing a diffusion process on the active surface of the first substrate at the first temperature; and
forming a plurality of common source plugs electrically connected to the active surface of the first substrate.

6. The method of claim 5, wherein the first temperature is higher than 800° C.

7. The method of claim 1, wherein forming the second memory cell circuit includes:
forming a plurality of word lines horizontally arranged on the inactive surface of the second substrate;
forming a plurality of bit lines on the word lines, the bit lines intersecting the word lines; and
forming a plurality of variable resistance layers on corresponding intersections between the word lines and the bit lines.

8. The method of claim 7,
wherein forming the second memory cell circuit further includes forming a plurality of through electrodes electrically connecting the word and bit lines to the conductive lines of the non-memory circuit, and
wherein the plurality of through electrodes vertically penetrates the second substrate.

9. A method of fabricating a fusion memory device, the method comprising:
forming a first memory cell circuit including a plurality of first memory cells on an active surface of a first substrate;

forming a non-memory circuit including a plurality of peripheral transistors on an active surface of a second substrate, and a plurality of conductive lines electrically connected to the peripheral transistors; and combining the first memory cell circuit with the non-memory circuit, wherein forming the first memory cell circuit includes:
performing a diffusion process on the active surface of the first substrate at a first temperature;
vertically stacking a plurality of gate electrodes on the active surface of the first substrate;
forming a plurality of vertical channels vertically penetrating the plurality of gate electrodes, each of the vertical channels being surrounded by a memory layer;
forming a plurality of common source plugs electrically connected to the active surface of the first substrate; and
forming a plurality of electrical lines electrically connected to the gate electrodes, the vertical channels, and the common source plugs, wherein combining the first memory cell circuit with the non-memory circuit includes:
aligning a first outer terminal of the first memory cell circuit, which is electrically connected to at least one of the electrical lines, with a second outer terminal of the non-memory circuit, which is electrically connected to at least one of the conductive lines; and
bonding the first outer terminal to the second outer terminal.

10. The method of claim 9, further comprising:
forming a second memory cell circuit including a plurality of second memory cells on an inactive surface of the second substrate,
wherein forming the second memory cell circuit is performed at a second temperature lower than the first temperature.

11. The method of claim 10, further comprising:
after combining the first memory cell circuit with the non-memory circuit, thinning the second substrate physically or chemically.

12. The method of claim 10,
wherein forming the second memory cell circuit includes forming a plurality of through electrodes electrically connected to the conductive lines of the non-memory circuit, and
wherein the plurality of through electrodes vertically penetrates the second substrate.

13. The method of claim 10, wherein forming the second memory cell circuit includes:
forming a plurality of word lines horizontally arranged on the inactive surface of the second substrate;
forming a plurality of bit lines on the word lines, the bit lines intersecting the word lines; and
forming a plurality of variable resistance layers on corresponding intersections between the word lines and the bit lines.

14. The method of claim 9, wherein the first memory cell circuit is physically and electrically connected to the non-memory circuit through the first and second outer terminals that are bonded to each other.

15. A method of fabricating a fusion memory device, the method comprising:
forming a first memory cell circuit including a plurality of first memory cells on an active surface of a first semiconductor substrate;
forming a non-memory circuit including a plurality of conductive lines on an active surface of a second semiconductor substrate;
combining the first memory cell circuit with the non-memory circuit; and
forming a second memory cell circuit including a plurality of second memory cells on an inactive surface of the second semiconductor substrate,
wherein forming the first memory cell circuit includes:
performing a diffusion process on the active surface of the first semiconductor substrate at a first temperature; and
forming a plurality of common source plugs electrically connected to the active surface of the first semiconductor substrate, and
wherein forming the second memory cell circuit excludes a diffusion process.

16. The method of claim 15, wherein forming the second memory cell circuit is performed at a second temperature lower than the first temperature.

17. The method of claim 15, wherein combining the first memory cell circuit with the non-memory circuit includes combining the first semiconductor substrate and the second semiconductor substrate with each other to allow the active surface of the second semiconductor substrate to face the active surface of the first semiconductor substrate.

18. The method of claim 15, further comprising:
after combining the first memory cell circuit with the non-memory circuit, thinning the second semiconductor substrate physically or chemically.

19. The method of claim 15, wherein forming the first memory cell circuit further includes:
vertically stacking a plurality of gate electrodes on the active surface of the first semiconductor substrate;
forming a plurality of vertical channels vertically penetrating the plurality of gate electrodes, each of the vertical channels being surrounded by a memory layer; and
forming a plurality of electrical lines electrically connected to the gate electrodes, the vertical channels, and the common source plugs.

20. The method of claim 15, wherein forming the second memory cell circuit includes:
forming a plurality of word lines horizontally arranged on the inactive surface of the second semiconductor substrate;
forming a plurality of bit lines on the word lines, the bit lines intersecting the word lines; and
forming a plurality of variable resistance layers on corresponding intersections between the word lines and the bit lines.

* * * * *